(12) United States Patent
Ryu et al.

(10) Patent No.: US 7,825,495 B2
(45) Date of Patent: Nov. 2, 2010

(54) SEMICONDUCTOR CHIP STRUCTURE, METHOD OF MANUFACTURING THE SEMICONDUCTOR CHIP STRUCTURE, SEMICONDUCTOR CHIP PACKAGE, AND METHOD OF MANUFACTURING THE SEMICONDUCTOR CHIP PACKAGE

(75) Inventors: Seung-Kwan Ryu, Yongin-si (KR); Hee-Kook Choi, Seoul (KR); Sung-Min Sim, Seongnam-si (KR); Dong-Hyeon Jang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 153 days.

(21) Appl. No.: 12/007,920

(22) Filed: Jan. 17, 2008

(65) Prior Publication Data

US 2008/0174025 A1 Jul. 24, 2008

(30) Foreign Application Priority Data

Jan. 24, 2007 (KR) .................. 10-2007-0007376

(51) Int. Cl.
*H01L 29/06* (2006.01)
(52) U.S. Cl. ...................... 257/622; 257/773
(58) Field of Classification Search ................ 257/622, 257/773–776, E23.016, E23.174
See application file for complete search history.

(56) References Cited

U.S. PATENT DOCUMENTS

| 5,972,193 | A | * | 10/1999 | Chou et al. ................. 205/122 |
| 6,316,288 | B1 | | 11/2001 | Hashimoto |
| 2004/0192024 | A1 | | 9/2004 | Ito |
| 2005/0000729 | A1 | * | 1/2005 | Iijima et al. ................. 174/260 |
| 2006/0220247 | A1 | * | 10/2006 | Hanaoka ...................... 257/738 |

FOREIGN PATENT DOCUMENTS

| JP | 2003-007701 | 1/2003 |
| JP | 2004-247535 | 9/2004 |

* cited by examiner

*Primary Examiner*—Steven Loke
*Assistant Examiner*—Kimberly M Thomas
(74) *Attorney, Agent, or Firm*—Harness, Dickey & Pierce P.L.C.

(57) ABSTRACT

A semiconductor chip structure may include a semiconductor chip, a first insulation layer and a redistribution layer. The first insulation layer may be formed on the semiconductor chip. The first insulation layer may have at least one first groove formed at an upper surface portion of the first insulation layer. Further, the at least one first groove may have an upper width and a lower width greater than the upper width. The redistribution layer may be partially formed on the first insulation layer. The redistribution layer may have at least one first protrusion formed on a lower surface portion of the redistribution layer. The first protrusion may have an upper width and a lower width less than the upper width. The first protrusion may be inserted into the at least one first groove.

19 Claims, 10 Drawing Sheets

SEMICONDUCTOR CHIP STRUCTURE, METHOD OF MANUFACTURING THE SEMICONDUCTOR CHIP STRUCTURE, SEMICONDUCTOR CHIP PACKAGE, AND METHOD OF MANUFACTURING THE SEMICONDUCTOR CHIP PACKAGE

PRIORITY STATEMENT

This application claims priority under 35 USC §119 to Korean Patent Application No. 2007-7376, filed on Jan. 24, 2007, in the Korean Intellectual Property Office (KIPO), the entire contents of which are herein incorporated by reference.

BACKGROUND

1. Field

Example embodiments relate to semiconductor chip structures, methods of manufacturing the semiconductor chip structures, a semiconductor chip package, and a method of manufacturing the semiconductor chip package. Other example embodiments relate to semiconductor chip structures that have improved adhesion strength by changing a structure of an insulation layer on a semiconductor chip, methods of manufacturing the semiconductor chip structures, a semiconductor chip package, and a method of manufacturing the semiconductor chip package.

2. Description of the Related Art

Generally, a semiconductor device may be manufactured in a fab process for forming semiconductor chips including electrical elements on a silicon wafer, used as a semiconductor substrate, an electrical die sorting (EDS) process for testing electrical characteristics of the semiconductor chips formed by the fab process, and a packaging process for encapsulating the semiconductor chips with an epoxy resin and for singularizing the semiconductor chips.

FIG. 1 is a cross-sectional view illustrating a conventional board-on-chip (BOC) package. Referring to FIG. 1, a conventional BOC package 1 may include a semiconductor chip 5 having pads. A first insulation layer 10 may be formed on the semiconductor chip 5 exposing the pads of the semiconductor chip 5. A redistribution layer 15 may be formed on the first insulation layer 10. The redistribution layer 15 may make contact with the pads. A second insulation layer 20 may be formed on the first insulation layer 10 and the redistribution layer 15 partially exposing the redistribution layer 15. An adhesive layer 25 may be formed on the second insulation layer 20. A printed substrate 30 may be placed on the adhesive layer 25 exposing the redistribution layer 15. A third insulation layer 35 may be formed on the printed substrate 30. Bonding wires 40 may electrically connect the redistribution layer 15 to the printed substrate 30. A molding layer 45 may cover the bonding wires 40. Solder balls 50 making contact with the printed substrate 30 may be formed on the third insulation layer 35.

In the conventional package, the first insulation layer 10, the redistribution layer 15, the second insulation layer 20, the adhesive layer 25 and the molding layer 45 may be interposed between the semiconductor chip 5 and the printed substrate 30. Because the above-mentioned layers include different materials that make contact with each other, adhesion strength between the above-mentioned layers may be relatively weak. Further, relatively large stress may be applied between the semiconductor chip 5 and the printed substrate 30. Therefore, peeling may generate between the first insulation layer 10 and the redistribution layer 15, the redistribution layer 15 and the second insulation layer 20, the second insulation layer 20 and the adhesive layer 25, and the adhesive layer 25 and the molding layer 45.

SUMMARY

Example embodiments provide semiconductor chip structures that are capable of preventing or reducing peeling of an insulation layer, a redistribution layer and/or an adhesive layer on a semiconductor chip. Example embodiments also provide methods of manufacturing the above-mentioned semiconductor chip structure. Example embodiments also provide a semiconductor chip package including the above-mentioned semiconductor chip structure. Example embodiments also provide a method of manufacturing the above-mentioned semiconductor chip package.

A semiconductor chip structure in accordance with example embodiments may include a semiconductor chip, a first insulation layer and a redistribution layer. The first insulation layer may be formed on the semiconductor chip. The first insulation layer may have at least one first groove formed at an upper surface portion of the first insulation layer. Further, the first groove may have an upper width and a lower width greater than the upper width. The redistribution layer may be partially formed on the first insulation layer. The redistribution layer may have at least one first protrusion formed on a lower surface portion of the redistribution layer. The first protrusion may have an upper width and a lower width less than the upper width. The first protrusion may be inserted into the first groove.

According to example embodiments, the first groove may be arranged in a matrix pattern, a parallel line pattern and/or a crisscross pattern. According to example embodiments, the first protrusion may be arranged in a matrix pattern, a parallel line pattern and/or a crisscross pattern. According to example embodiments, the first insulation layer may include a negative-type photoresist material. According to example embodiments, the redistribution layer may have an upper face substantially coplanar with that of the first insulation layer. Alternatively, the redistribution layer may have an upper face higher than that of the first insulation layer.

Additionally, the semiconductor chip structure may include a second insulation layer and an adhesive layer. The second insulation layer may be formed on the redistribution layer and the first insulation layer. The second insulation layer may have at least one second protrusion formed on a lower surface portion of the second insulation layer, and at least one second groove formed at an upper surface portion of the second insulation layer. The second protrusion may have an upper width and a lower width less than the upper width. The second protrusion may be inserted into the first groove. The second groove may have an upper width and a lower width greater than the upper width. The adhesive layer may have at least one third protrusion inserted into the second groove. The third protrusion may have an upper width and a lower width less than the upper width. Further, the first insulation layer may have a first hole exposing a pad of the semiconductor chip. The redistribution layer may be formed in the first hole to be electrically connected to the pad of the semiconductor chip. The second insulation layer may have a second hole exposing a portion of the redistribution layer in the first hole.

A semiconductor chip structure in accordance with example embodiments may include a semiconductor chip, a first insulation layer, a redistribution layer, a second insulation layer and an adhesive layer. The first insulation layer may be formed on the semiconductor chip. The first insulation layer may have a first hole exposing a pad of the semiconductor chip. The redistribution layer may be partially formed on the first insulation layer and in the first hole to make contact with the pad. The second insulation layer may be formed on the redistribution layer and the first insulation layer. The second insulation layer may have at least one groove formed at an upper surface portion of the second insulation layer. The groove may have an upper width and a lower width greater than the upper width. The adhesive layer may be formed on the second insulation layer. The adhesive layer may have at least one protrusion inserted into the groove. The protrusion may have an upper width and a lower width less than the upper width.

In a method of manufacturing a semiconductor chip structure in accordance with example embodiments, a first insulation layer may be formed on a semiconductor chip. The first insulation layer may have at least one first groove formed at an upper surface portion of the first insulation layer. Further, the first groove may have an upper width and a lower width greater than the upper width. A redistribution layer may be partially formed on the first insulation layer. The redistribution layer may have at least one first protrusion formed at a lower surface portion of the redistribution layer. The first protrusion may have an upper width and a lower width less than the upper width. The first protrusion may be inserted into the first groove.

According to example embodiments, the first insulation layer may be formed by coating a first negative-type photoresist material on the semiconductor chip to form a lower insulation layer, exposing all of the lower insulation layer, coating a second negative-type photoresist material on the lower insulation layer to form an upper insulation layer; exposing the upper insulation layer, an exposed portion of the upper insulation layer having an upper width and a lower width greater than the upper width, and by developing the exposed portion of the upper insulation layer.

According to example embodiments, the first groove may be arranged in a matrix form, a parallel line pattern and/or a crisscross pattern. According to example embodiments, the first protrusion may be arranged in a matrix form, a parallel line pattern and/or a crisscross pattern. According to example embodiments, the redistribution layer may have an upper face substantially coplanar with that of the first insulation layer. Alternatively, the redistribution layer may have an upper face higher than that of the first insulation layer. According to example embodiments, the redistribution layer may be formed by an electroplating process and/or a deposition process.

According to example embodiments, the method may further include forming a second insulation layer on the redistribution layer and the first insulation layer, the second insulation layer having at least one second protrusion, which has an upper width and a lower width less than the upper width, formed at a lower surface portion of the second insulation layer to be interlocked with the first groove, and at least one second groove, which has an upper width and a lower width greater than the upper width, formed at an upper surface portion of the second insulation layer; and forming an adhesive layer on the second insulation layer, the adhesive layer having at least one third protrusion, which has an upper width and a lower width less than the upper width, interlocked with the second groove.

Further, the method may further include forming a first hole through the first insulation layer to expose a pad of the semiconductor chip. The redistribution layer may be formed in the first hole to be connected to the pad. The first hole and the first groove may be formed simultaneously with each other. The method may further include forming a second hole through the second insulation layer to expose the redistribution layer in the first hole. The second hole and the second groove may be formed simultaneously with each other.

In a method of manufacturing a semiconductor chip structure in accordance with example embodiments, a first insulation layer may be formed on a semiconductor chip. The first insulation layer may have a first hole that exposes a pad of the semiconductor chip. A redistribution layer may be partially formed on the first insulation layer and in the first hole to be connected to the pad. A second insulation layer may be formed on the redistribution layer and the first insulation layer. The second insulation layer may have at least one groove, which has an upper width and a lower width greater than the upper width, formed at an upper surface portion of the second insulation layer. An adhesive layer may be formed on the second insulation layer. The adhesive layer may have at least one protrusion, which has an upper width and a lower width less than the upper width, interlocked with the second groove.

A semiconductor chip package in accordance with example embodiments may include the semiconductor chip structure according to example embodiments, a printed substrate, a bonding wire and a molding layer. The printed substrate may be formed on the adhesive layer. The printed substrate may have a third hole that exposes the second hole of the second insulation layer. The bonding wire may electrically connect the redistribution layer to the printed substrate through the third hole. The molding layer may surround the bonding wire to fill the second hole and the third hole.

In a method of manufacturing a semiconductor chip package in accordance with example embodiments, a semiconductor chip structure may be formed according to example embodiments. An adhesive layer may be formed on the second insulation layer. The adhesive layer may have at least one third protrusion, which has an upper width and a lower width less than the upper width, interlocked with the second groove. A printed substrate may be formed on the adhesive layer. The printed substrate may have a third hole that exposes the second hole of the second insulation layer. The redistribution layer may be electrically connected to the printed substrate using a bonding wire through the third hole. The bonding wire may be surrounded with a molding layer to fill the second hole and the third hole.

According to example embodiments, contact areas between an insulation layer and a redistribution layer, and the insulation layer and an adhesive layer, may become enlarged so that external stress may be dispersed. Further, adhesion strength between the insulation layer and the redistribution layer, and the insulation layer and the adhesive layer, may be reinforced so that the insulation layer, the redistribution layer, and the adhesive layer may not peel off of each other.

BRIEF DESCRIPTION OF THE DRAWINGS

Example embodiments will be more clearly understood from the following detailed description taken in conjunction with the accompanying drawings. FIGS. 1-8K represent non-limiting, example embodiments as described herein.

FIG. 1 is a cross-sectional view illustrating a conventional semiconductor chip package;

FIG. 2 is a cross-sectional view illustrating a semiconductor chip structure in accordance with example embodiments;

FIG. 3 is an enlarged cross-sectional view illustrating the semiconductor chip structure in FIG. 2;

FIG. 4 is a cross-sectional view illustrating a semiconductor chip structure in accordance with example embodiments;

FIG. 5 is a cross-sectional view illustrating a semiconductor chip structure in accordance with example embodiments;

FIG. 7 is a cross-sectional view illustrating a semiconductor chip package in accordance with example embodiments; and FIGS. 8A to 8K are cross-sectional views illustrating a method of manufacturing the semiconductor chip package in FIG. 7.

Figure 1:
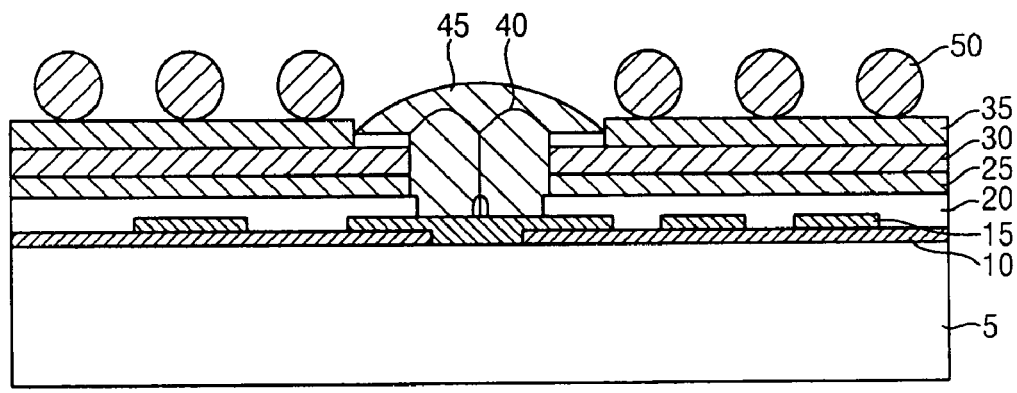

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments are described more fully hereinafter with reference to the accompanying drawings, in which example embodiments are shown. Example embodiments may, however, be embodied in many different forms and should not be construed as limited to the embodiments set forth herein. Rather, these embodiments are provided so that this disclosure will be thorough and complete, and will fully convey the scope of example embodiments to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
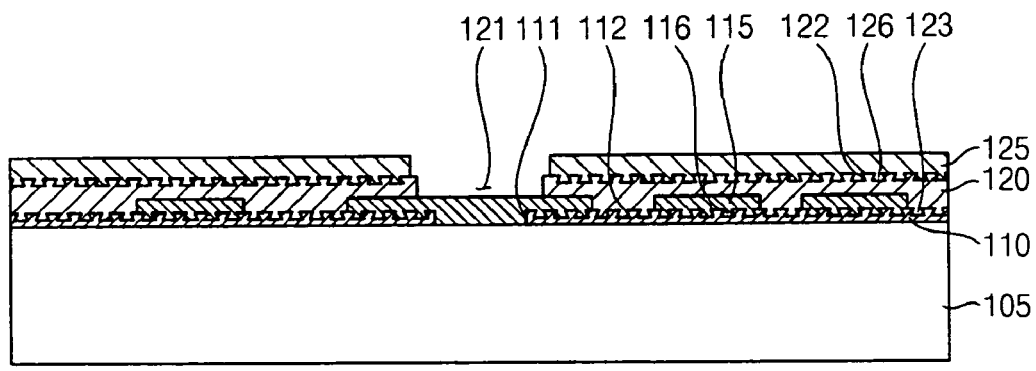
Figure 3:
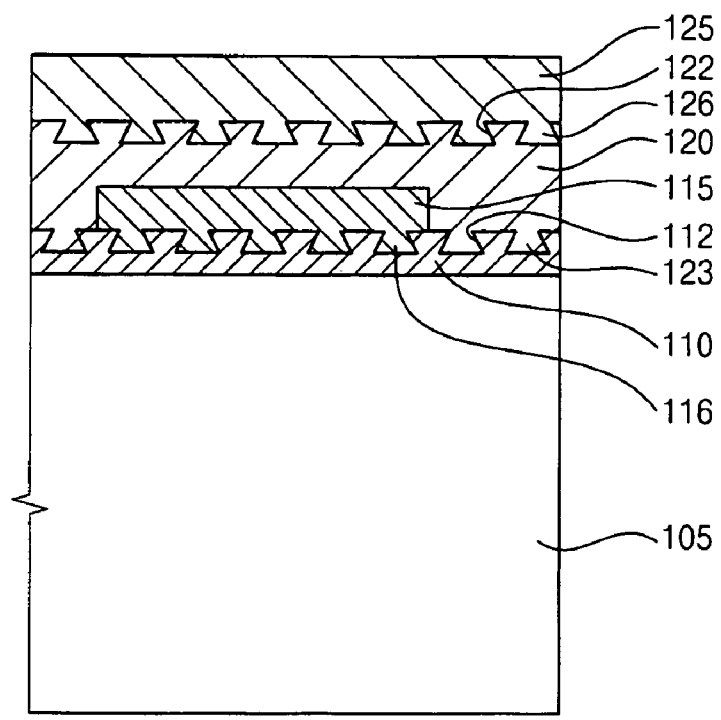

FIG. 2 is a cross-sectional view illustrating a semiconductor chip structure in accordance with example embodiments, and FIG. 3 is an enlarged cross-sectional view illustrating the semiconductor chip structure in FIG. 2. Referring to FIGS. 2 and 3, a semiconductor chip structure 100 according to example embodiments may include a semiconductor chip 105, a first insulation layer 110, a redistribution layer 115, a second insulation layer 120 and an adhesive layer 125.

The semiconductor chip 105 may have an active face on which pads (not shown) are arranged. In example embodiments, the active face of the semiconductor chip 105 may be oriented in an upward direction. For example, the active face may correspond to an upper face of the semiconductor chip 105. Further, the semiconductor chip 105 may correspond to a center pad type semiconductor chip, the pads being arranged on a central portion thereof. Alternatively, the semiconductor chip 105 may correspond to an edge pad type semiconductor chip, the pads being arranged on an edge portion.

The first insulation layer 110 may be formed on the upper face of the semiconductor chip 105. The first insulation layer 110 may have a first hole 111 formed through a central portion of the first insulation layer 110. The first hole 111 exposes the pads. Further, the first insulation layer 110 may have at least one first groove 112. The first groove 112 may have an upper width and a lower width less than the upper width. In example embodiments, the first insulation layer 110 may include a lower insulation layer on the semiconductor chip 105 and an upper insulation layer on the lower insulation layer. The first hole 111 may be formed through the lower insulation layer and the upper insulation layer. In contrast, the first groove 112 may be formed only at the upper insulation layer.

In example embodiments, the first insulation layer 110 may include a negative-type photoresist material. A low-molecular-weight compound in a portion of the negative-type photoresist material, which is exposed to light, may be converted into a high-molecular-weight compound. Thus, the exposed portion of the negative-type photoresist material may have relatively lower solubility than that of a portion of the negative-type photoresist material not exposed to light. As a result, the unexposed portion of the negative-type photoresist material may be more readily removed in a developing process compared to the exposed portion. Therefore, the unexposed portion of the negative-type photoresist material may be removed in the developing process to form the first groove 112.

The redistribution layer 115 may be partially formed on the first insulation layer 110. Further, the redistribution layer 115 may be formed in the first hole 111 of the first insulation layer 110. Thus, the first redistribution layer 115 may make contact with the pads. The first groove 112 of the first insulation layer 110 may be filled with the redistribution layer 115. As a result, at least one first protrusion 116 may be formed at a lower surface portion of the redistribution layer 115. The first protrusion 116 may have an upper width and a lower width greater than the upper width. Because a contact area between the redistribution layer 115 and the first insulation layer 110 due to the first groove 112 and the first protrusion 116 becomes enlarged, external stress may be dispersed. Further, because the first protrusion 116 of the redistribution layer 115 is interlocked with the first groove 112 of the first insulation layer 110, the first insulation layer 110 and the redistribution layer 115 may not peel off each other.

In example embodiments, the first groove 112 of the first insulation layer 110 may be arranged in a matrix form, a parallel line pattern and/or a crisscross pattern. The first groove 112 may be configured to receive the first protrusion 116 of the redistribution layer 115.

In example embodiments, the first protrusion 116 of the redistribution layer 115 may be arranged in a matrix form, a parallel line pattern and/or a crisscross pattern. The first groove 112 of the first insulation layer 110 may be configured to receive the first protrusion 116 of the redistribution layer 115. The redistribution layer 115 may include a metal. In example embodiments, the redistribution layer 115 may be formed by an electroplating process. Alternatively, the redistribution layer 115 may be formed by a deposition process.

In example embodiments, the redistribution layer 115 may have an upper face higher than that of the first insulation layer 110. Alternatively, the upper face of the redistribution layer 115 may be substantially coplanar with that of the first insulation layer 110. The redistribution layer 115 may be formed only in the first groove 112 of the first insulation layer 110. The first groove 112 may have a size substantially equal to or sufficiently larger than that of the redistribution layer 115.

The second insulation layer 120 may be formed on the first insulation layer 110 and the redistribution layer 115. The second insulation layer 120 may have a second hole 121 formed through a central portion of the second insulation layer 120. The redistribution layer 115 may be partially exposed through the second hole 121. The first groove 112 may be filled with the second insulation layer 120. Thus, the second insulation layer 120 may have at least one second protrusion 123. The second protrusion 123 may have an upper width and a lower width less than the upper width. Because a contact area between the first insulation layer 110 and the second insulation layer 120 due to the first groove 112 and the second protrusion 123 becomes enlarged, external stress may be dispersed. Further, because the second protrusion 123 is interlocked with the first groove 112 of the first insulation layer 110 with the redistribution layer 115 surrounded by the second insulation layer 120, the first insulation layer 110 and the second insulation layer 120 may not peel off each other.

Further, the second insulation layer 120 may have at least one second groove 122. The second groove 122 may have an upper width and a lower width greater than the upper width. The second groove 122 may have a configuration substantially identical to that of the first groove 112 so that any further illustrations with respect to the second groove 122 may be omitted herein for brevity. In example embodiments, the second insulation layer 120 may include a lower insulation layer on the first insulation layer 110 and the redistribution layer 115, and an upper insulation layer on the lower insulation layer. The second hole 121 may be formed through the lower insulation layer and the upper insulation layer. The second protrusion 123 may be protruded from a lower face of the lower insulation layer. The second groove 122 may be formed only on the upper insulation layer. Further, the second insulation layer 120 may include a negative-type photoresist material.

The adhesive layer 125 may be formed on the second insulation layer 120 except for the second hole 121. The second groove 122 of the second insulation layer 120 may be filled with the adhesive layer 125. Thus, the adhesive layer 125 may have at least one third protrusion 126. The third protrusion may have an upper width and a lower width less than the upper width. Because a contact area between the second insulation layer 120 and the adhesive layer 125 due to the second groove 122 and the third protrusion 126 becomes enlarged, external stress may be dispersed. Further, because the third protrusion 126 of the adhesive layer 125 is interlocked with the second groove 122 of the second insulation layer 120, the adhesive layer 125 and the second insulation layer 120 may not peel off each other. In example embodiments, the adhesive layer 125 may include an insulation material. Examples of the adhesive layer 125 may include epoxy, adhesive and/or tape.

According to example embodiments, the contact area between the different layers may become enlarged by improving structures of the first insulation layer 110 and the second insulation layer 120. Thus, the external stress may be dispersed. Further, adhesion strength between the different layers may be reinforced so that the different layers may not peel off each other.

Figure 4:
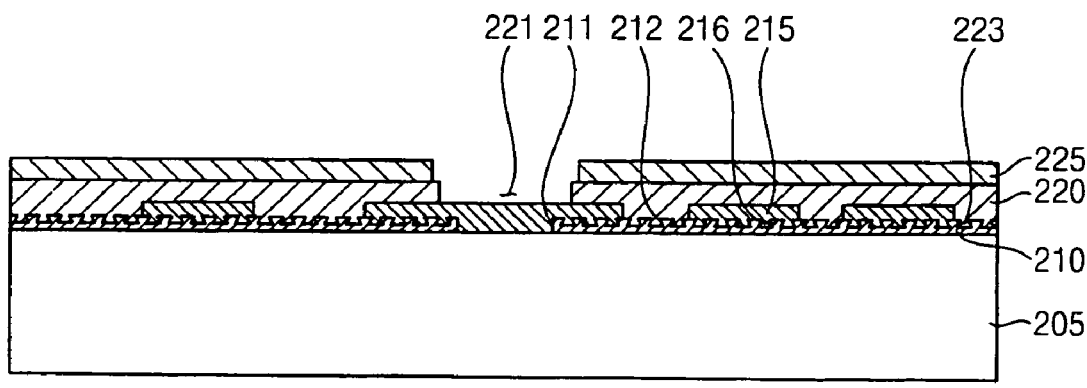

FIG. 4 is a cross-sectional view illustrating a semiconductor chip structure in accordance with example embodiments. Referring to FIG. 4, a semiconductor chip structure 200 of example embodiments may include a semiconductor chip 205, a first insulation layer 210, a redistribution layer 215, a second insulation layer 220 and an adhesive layer 225. The first insulation layer 210, the redistribution layer 215, the second insulation layer 220 and the adhesive layer 225 may be substantially the same as the first insulation layer 110, the redistribution layer 115, the second insulation layer 120 and the adhesive layer 125 in FIGS. 2 and 3 except that the second insulation layer 220 may not include at least one groove having an upper width and a lower width greater than the upper width, and the adhesive layer 225 may not include at least one protrusion having an upper width and a lower width less than the upper width.

Figure 5:
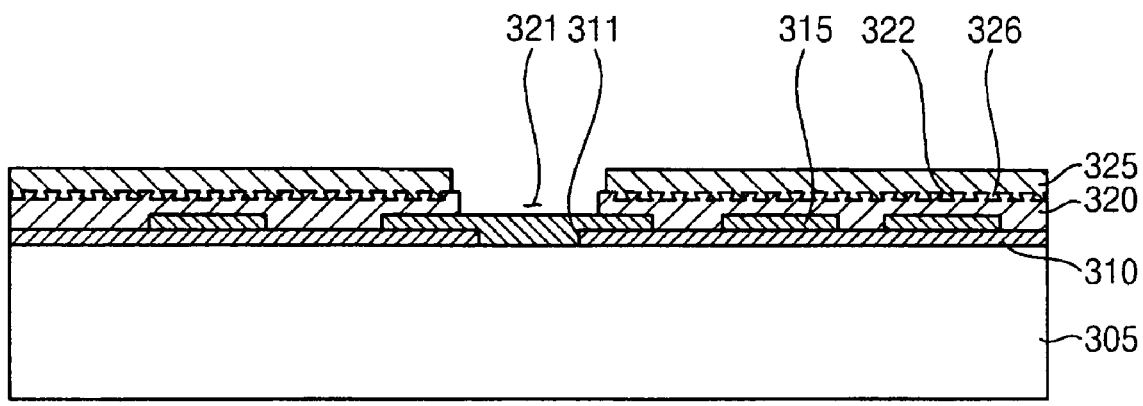

FIG. 5 is a cross-sectional view illustrating a semiconductor chip structure in accordance with example embodiments. Referring to FIG. 5, a semiconductor chip structure 300 of example embodiments may include a semiconductor chip 305, a first insulation layer 310, a redistribution layer 315, a second insulation layer 320 and an adhesive layer 325. The first insulation layer 310, the redistribution layer 315, the second insulation layer 320 and the adhesive layer 325 may be substantially the same as the first insulation layer 110, the redistribution layer 115, the second insulation layer 120 and the adhesive layer 125 in FIGS. 2 and 3 except that the first insulation layer 310 may not include at least one groove having an upper width and a lower width greater than the upper width, and the redistribution layer 315 and the second insulation layer 320 may not include at least one protrusion having an upper width and a lower width less than the upper width, respectively.

Figure 6A:
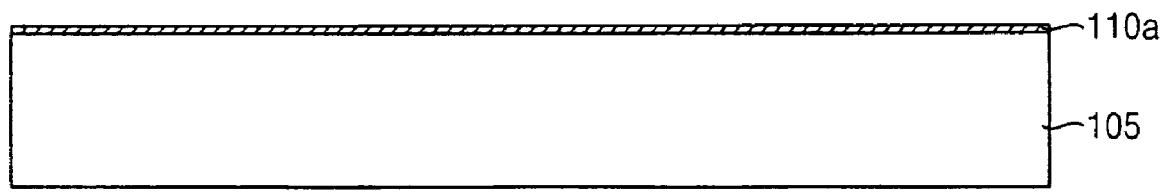
FIGS. 6A to 6G are cross-sectional views illustrating a method of manufacturing the semiconductor chip structure in FIG. 2.
Figure 6B:
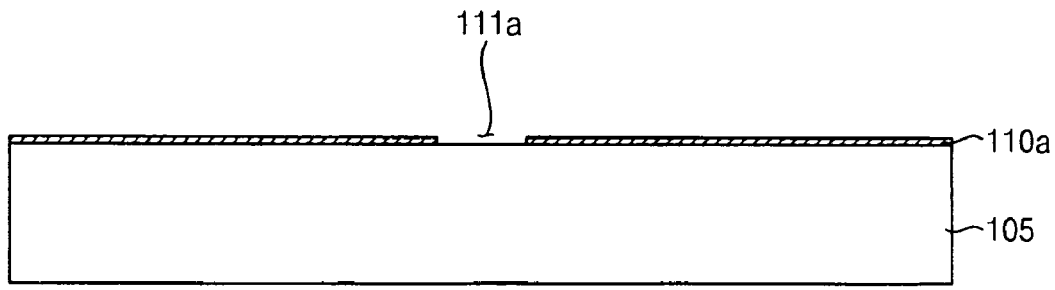

FIGS. 6A to 6G are cross-sectional views illustrating a method of manufacturing the semiconductor chip structure in FIG. 2. Referring to FIG. 6A, a negative-type insulation photoresist material may be formed on an active face of a semiconductor chip 105 to form a lower insulation layer 110a. In example embodiments, an example of the photoresist material may include photoresist. Referring to FIG. 6B, the lower insulation layer 110a may be exposed and developed to form a preliminary hole 111a exposing pads of the semiconductor chip 105.

Figure 6C:
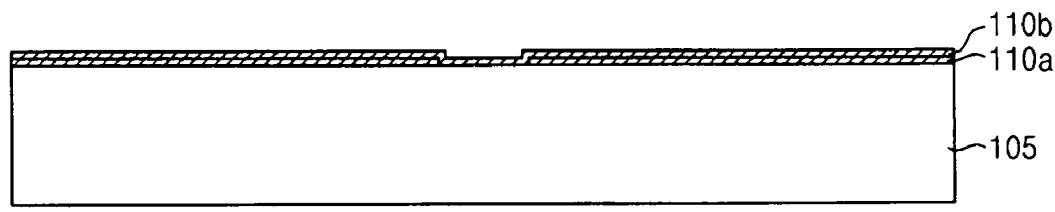
Figure 6D:
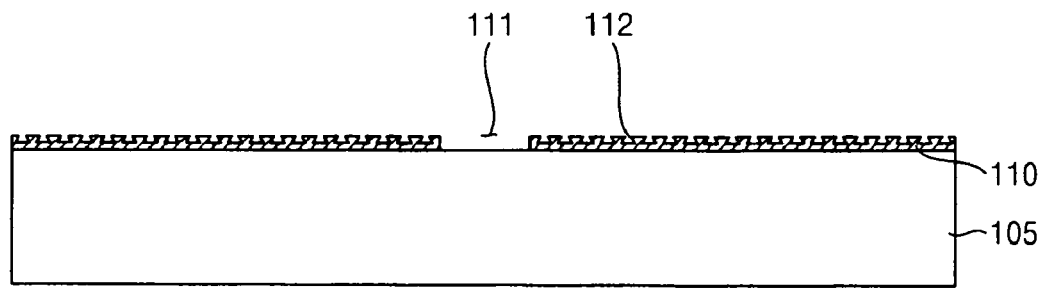

Referring to FIG. 6C, a negative-type insulation photoresist material may be formed on the lower insulation layer 110a and in the preliminary hole 111a to form an upper insulation layer 110b. Referring to FIG. 6D, a first region of the upper insulation layer 110b in the preliminary hole 111a and a second region of the upper insulation layer 110b on the lower insulation layer 110a may be exposed using different light intensities.

In example embodiments, the first region may be exposed using a first light intensity. Thus, an exposed portion of the first region may have an upper width and a lower width substantially the same as the upper width. In contrast, the second region may be exposed using a second light intensity weaker than the first light intensity. Thus, an exposed portion of the second region may have an upper width and a lower width greater than the upper width. Further, the first region and the second region may be exposed simultaneously with each other. The exposure process may use a gray mask for controlling light exposure in accordance with exposed portions. Because the lower insulation layer 110a has previously been exposed, the lower insulation layer 110a may not be influenced by the exposure of the upper insulation layer 110b.

The upper insulation layer 110b may then be developed. Because the upper insulation layer 110b includes the negative-type photoresist material, unexposed portions of the upper insulation layer 110b may be removed. As a result, a first insulation layer 110 including the lower insulation layer 110a and the upper insulation layer 110b may be formed on the semiconductor chip 105. The first insulation layer 110 may have a first hole 111 exposing the pads, and at least one first groove 112 having an upper width and a lower width greater than the upper width.

In example embodiments, the first groove 112 of the first insulation layer 110 may be arranged in a matrix form, a parallel line pattern and/or a crisscross pattern. In example embodiments, the rest portion of the first insulation layer 110 except for the first groove 112 may be arranged in a matrix form, a parallel line pattern and/or a crisscross pattern.

Figure 6E:
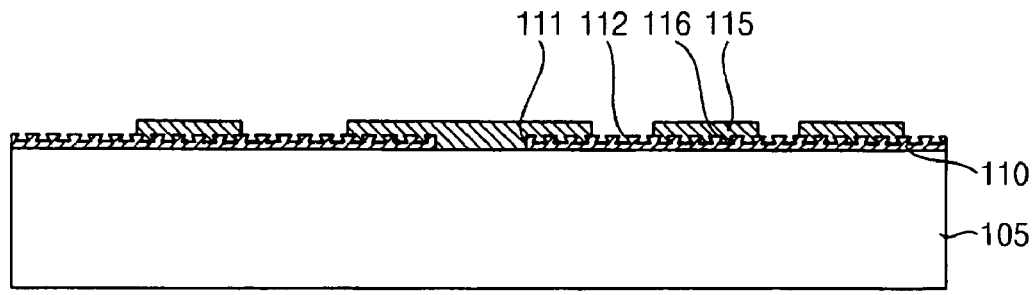

Referring to FIG. 6E, a redistribution layer 115 may be partially formed on the first insulation layer 110 to fill the first hole 111. Thus, the redistribution layer 115 may be connected to the pads of the semiconductor chip 105 through a portion of the redistribution layer 115 in the first hole 111. In example embodiments, the redistribution layer 115 may include a metal. In example embodiments, the redistribution layer 115 may be formed by forming a seed layer on the first insulation layer 110, and by electroplating the seed layer. In example embodiments, the redistribution layer 115 may be formed by depositing a metal on the first insulation layer 110.

The first groove 112 of the first insulation layer 115 may be filled with the redistribution layer 115. Thus, the redistribution layer 115 may have at least one first protrusion 116, which has an upper width and a lower width less than the upper width, formed on a lower surface portion of the redistribution layer 115. Because a contact area between the redistribution layer 115 and the first insulation layer 110 becomes enlarged due to the first groove 112 and the first protrusion 116, external stress may be dispersed. Further, the first protrusion 116 of the redistribution layer 115 may be interlocked with the first groove 112 of the first insulation layer 110 so that the redistribution layer 115 and the first insulation layer 110 may not peel off each other.

In example embodiments, the redistribution layer 115 may have an upper face higher than that of the first insulation layer 110. Alternatively, the redistribution layer 115 may have an upper face substantially coplanar with that of the first insulation layer 110. The redistribution layer 115 may be formed only in the first groove 112 of the first insulation layer 110. To ensure that the redistribution layer in the first groove 112 redistributes the pads, the first groove 112 may have a size substantially equal to or sufficiently larger than that of the redistribution layer 115.

Figure 6F:
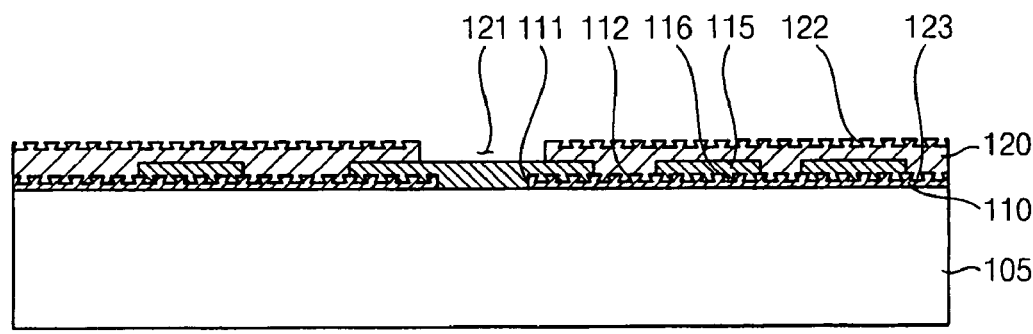

Referring to FIG. 6F, a second insulation layer 120 may be formed on the first insulation layer 110 and the redistribution layer 115. The second insulation layer 120 may have a second hole 121 formed through a central portion of the second insulation layer 120. The second hole 121 may expose the redistribution layer 115. Processes for forming the second insulation layer 120 may be substantially the same as those for forming the first insulation layer 110 illustrated with reference to FIGS. 6A to 6D so that any further illustrations with respect to the processes for forming the second insulation layer 120 are omitted herein for brevity.

Because the first groove 112 of the first insulation layer 110 is filled with the second insulation layer 120, the second insulation layer 120 may have at least one second protrusion 123, which has an upper width and a lower width less than the upper width, formed on a lower surface portion of the second insulation layer 120. Further, the second insulation layer 120 may have at least one second groove 122, which has an upper width and a lower width greater than the upper width, formed at an upper surface portion of the second insulation layer 120. Because a contact area between the first insulation layer 110 and the second insulation layer 120 becomes enlarged due to the first groove 112 and the second protrusion 123, external stress may be dispersed. Further, the second protrusion 123 of the second insulation layer 120 may be interlocked with the first groove 112 of the first insulation layer 110 with the second insulation layer 120 surrounding the redistribution layer 115 so that the redistribution layer 115 and the second insulation layer 120 may not peel off each other.

Figure 6G:
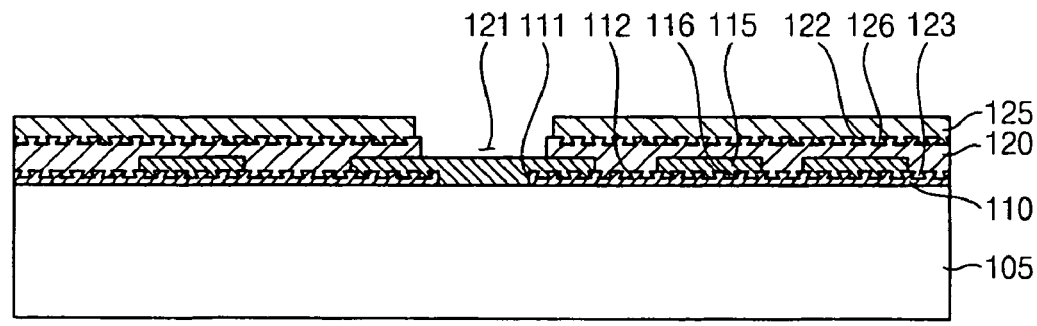

Referring to FIG. 6G, an adhesive layer 125 may be formed on the second insulation layer 120 except for the second hole 121. In example embodiments, the adhesive layer 125 may be formed by coating an epoxy or an adhesive, or by attaching a tape. The second groove 122 of the second insulation layer 120 may be filled with the adhesive layer 125. Thus, the adhesive layer 125 may have at least one third protrusion 126, which has an upper width and a lower width less than the upper width, formed on a lower surface portion of the adhesive layer 125. Because a contact area between the adhesive layer 125 and the second insulation layer 120 becomes enlarged due to the second groove 122 and the third protrusion 126, external stress may be dispersed. Further, the third protrusion 126 of the adhesive layer 125 may be interlocked with the second groove 122 of the second insulation layer 120 so that the adhesive layer 125 and the second insulation layer 120 may not peel off each other.

Methods of manufacturing the semiconductor chip structures in FIGS. 3 and 4 are substantially the same as that of manufacturing the semiconductor chip structure in FIG. 2 except that a groove may not be formed on any one of the first insulation layer and the second insulation layer. Thus, any further illustrations with respect to the methods of manufacturing the semiconductor chip structures in FIGS. 3 and 4 are omitted herein for brevity.

Figure 7:
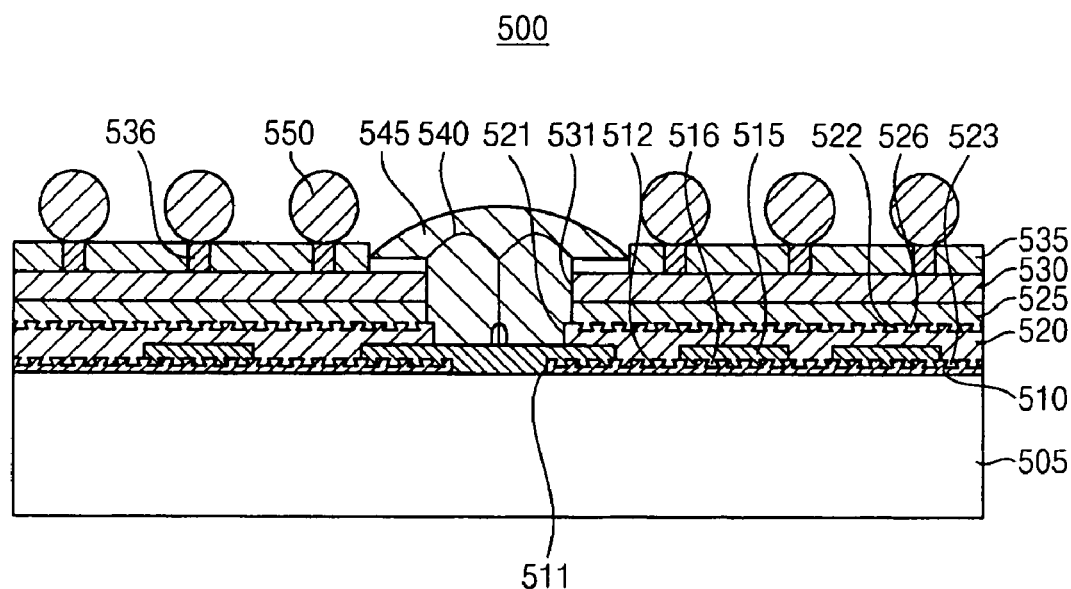

FIG. 7 is a cross-sectional view illustrating a semiconductor chip package in accordance with example embodiments. Referring to FIG. 7, a semiconductor chip package 500 of example embodiments may include a semiconductor chip 505, a first insulation layer 510, a redistribution layer 515, a second insulation layer 520, an adhesive layer 525, a printed substrate 530, a third insulation layer 535, a bonding wire 540, a molding layer 545 and a solder ball 550.

The semiconductor chip 505, the first insulation layer 510, the redistribution layer 515, the second insulation layer 520 and the adhesive layer 525 may be substantially the same as the semiconductor chip 105, the first insulation layer 110, the redistribution layer 115, the second insulation layer 120 and the adhesive layer 125 in FIG. 2, respectively. Thus, any further illustrations with respect to the semiconductor chip 505, the first insulation layer 510, the redistribution layer 515, the second insulation layer 520 and the adhesive layer 525 may be omitted herein for brevity.

The printed substrate 530 may be attached on the adhesive layer 525. The printed substrate 530 may have a third hole 531 exposing the second hole 521 of the second insulation layer 520. Further, the printed substrate 530 may have a printed pattern (not shown). Examples of the printed substrate 530 may include a printed circuit board (PCB), a tape printed substrate and/or a ceramic substrate.

The third insulation layer 535 may be formed on the printed substrate 530. The third insulation layer 535 may have a plurality of fourth holes 536 exposing the printed pattern of the printed substrate 530. The third insulation layer 535 may include an insulation material, e.g., polyimide.

The bonding wire 540 may electrically connect the printed pattern of the printed substrate 530 to the redistribution layer 515 through the third hole 531 and the second hole 521. Examples of the bonding wire 540 may include a gold (Au) wire and/or an aluminum (Al) wire. The molding layer 545 may surround the bonding wire 540 to fill the second hole 521 and the third hole 531. The molding layer 545 may protect the bonding wire 540 from the external environment. Examples of the molding layer 545 may include glop top and/or an epoxy molding compound.

The solder balls 550 on the third insulation layer 535 may be electrically connected to the printed substrate 530. In example embodiments, the solder balls 550 may be arranged in the fourth holes 536 of the third insulation layer 535, respectively, to be electrically connected to the printed substrate 530.

According to example embodiments, contact areas between the insulation layers 510 and 520, and the redistribution layer 515, which are interposed between the semiconductor chip 505 and the printed substrate 530, may become enlarged. Thus, the insulation layers 510 and 520, and the redistribution layer 515 may not peel off each other. As a result, the semiconductor chip package 500 may have improved reliability.

FIGS. 8A to 8K are cross-sectional views illustrating a method of manufacturing the semiconductor chip package in FIG. 7. Referring to FIGS. 8A to 8G, a first insulation layer 510, a redistribution layer 515, a second insulation layer 520 and an adhesive layer 525 may be formed on a semiconductor chip 505.

Figure 8A:
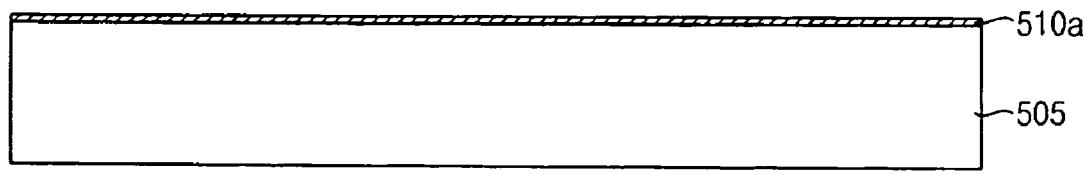
Figure 8B:
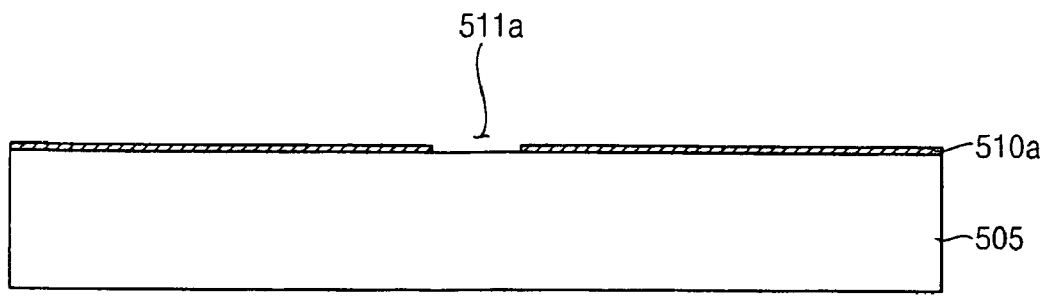
Figure 8C:
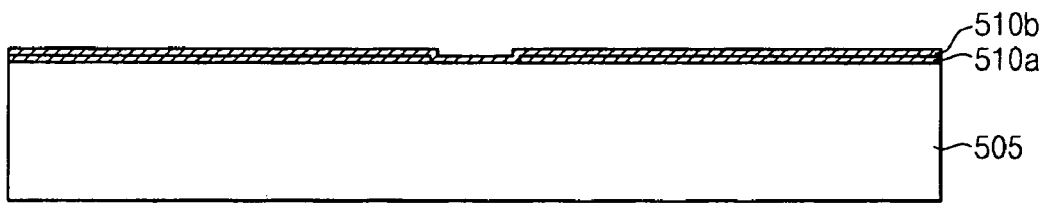
Figure 8D:
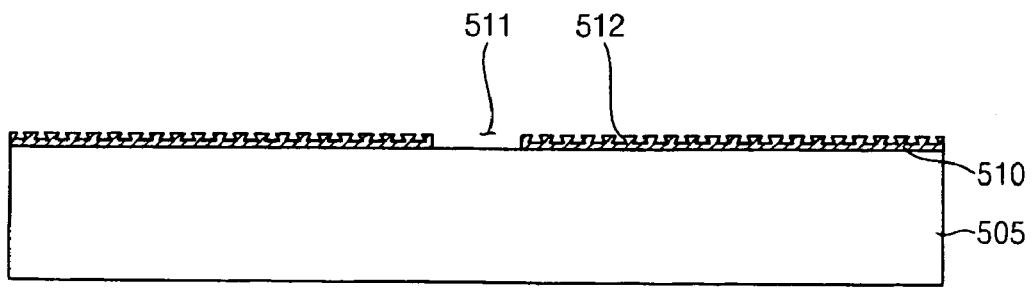
Figure 8E:
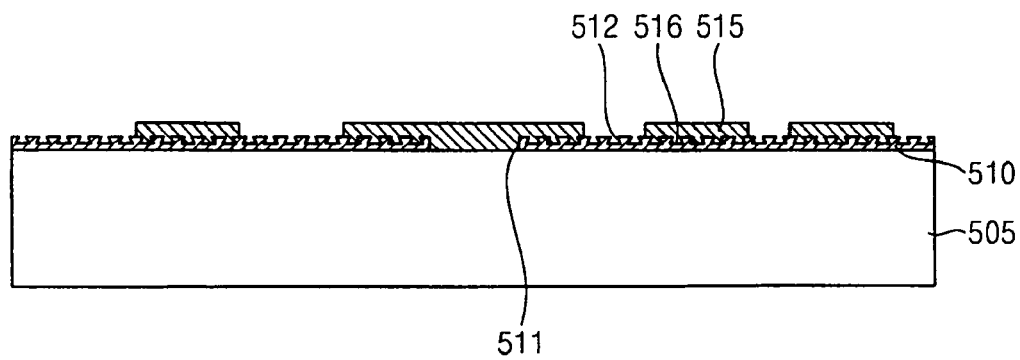
Figure 8F:
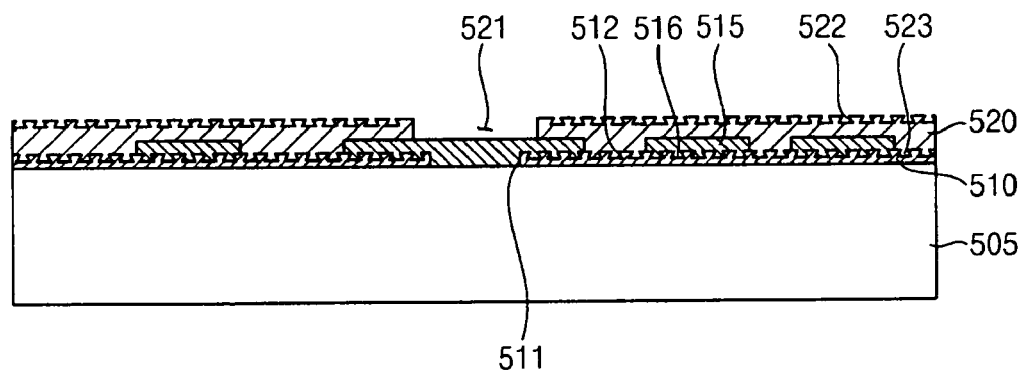
Figure 8G:
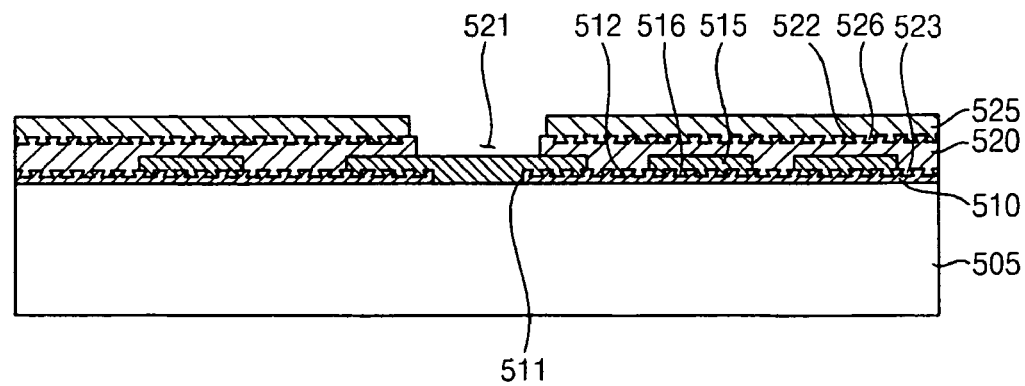
Figure 8H:
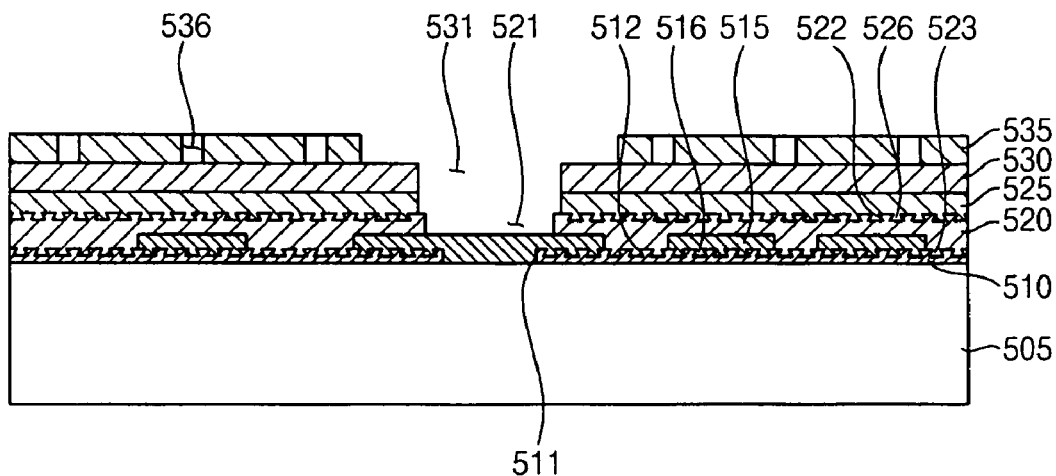

Processes for forming the first insulation layer 510, the redistribution layer 515, the second insulation layer 520 and the adhesive layer 525 may be substantially the same as those for forming the first insulation layer 110, the redistribution layer 115, the second insulation layer 120 and the adhesive layer 125 illustrated with reference to FIGS. 5A to 5G. Thus, any further illustrations with respect to the processes for forming the first insulation layer 510, the redistribution layer 515, the second insulation layer 520 and the adhesive layer 525 are omitted herein for brevity. Referring to FIG. 8H, a printed substrate 530 having a third hole 531 may be attached to the adhesive layer 525. The third hole 531 may expose the second hole 521 of the second insulation layer 520.

A third insulation layer 535 may be formed on the printed substrate 530. The third insulation layer 535 may be formed by coating polyimide or by attaching a polyimide tape. The third insulation layer 535 may be partially removed to form a plurality of fourth holes 536. The removal of the third insulation layer 535 may be carried out by a chemical etching process and/or a laser etching process. In example embodiments, the third insulation layer 535 may be formed on the printed substrate 530 after attaching the printed substrate 530. In example embodiments, the printed substrate 530 may be attached after forming the third insulation layer 535 on the printed substrate 530.

Figure 8I:
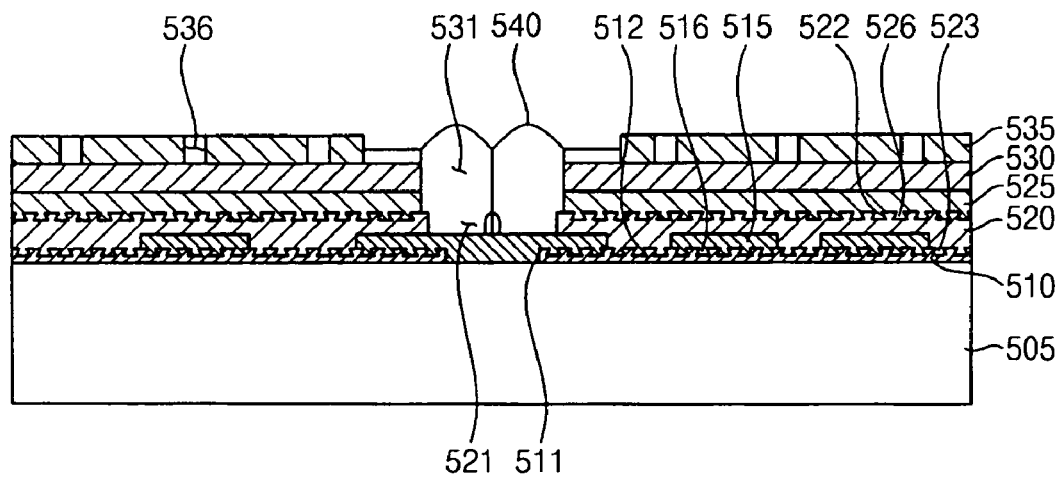
Figure 8J:
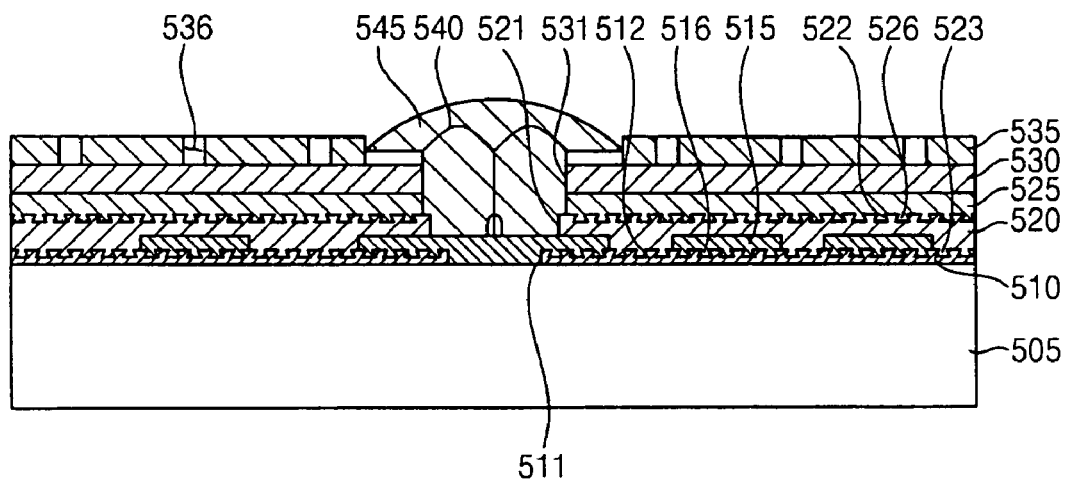
Figure 8K:
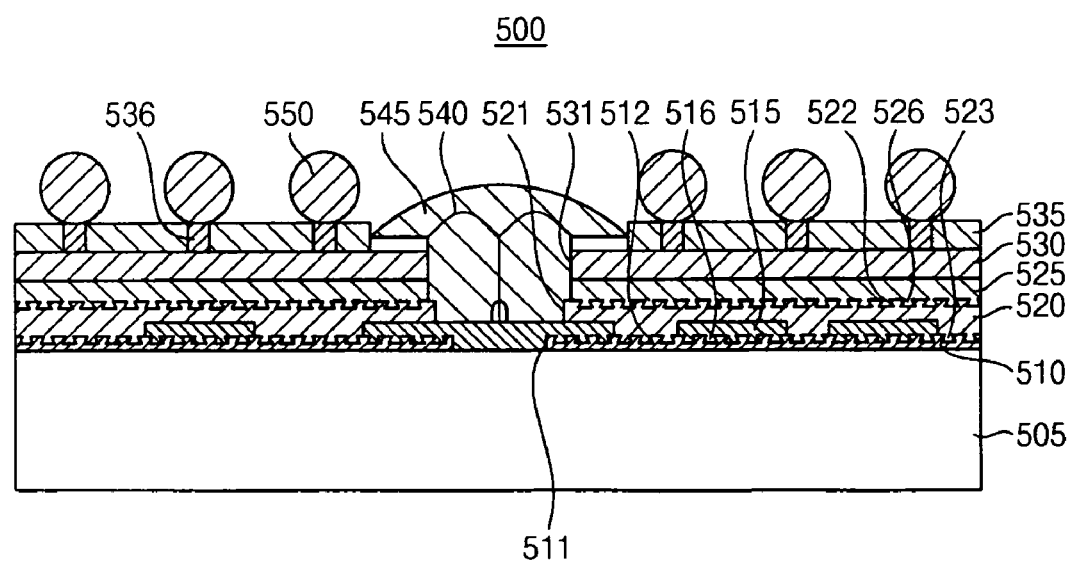

Referring to FIG. 8I, the printed pattern of the printed substrate 530 may be electrically connected to the redistribution layer 515 using a bonding wire 540 through the third hole 531 and the second hole 521. Referring to FIG. 8J, the second hole 521 and the third hole 531 may be filled with a molding material to surround the bonding wire with the molding material. Examples of the molding material may include glop top and/or an epoxy molding compound. The molding material may then be hardened to form a molding layer 545. Referring to FIG. 8K, solder balls 550 may be mounted to the printed pattern of the printed substrate 530 exposed through the fourth holes 536 of the third insulation layer 535. The semiconductor chip package 500 may be loaded into a high-temperature furnace to firmly attach the solder balls 550 to the printed substrate 530.

According to example embodiments, a groove having an upper width and a lower width greater than the upper width may be formed on an insulation layer between a semiconductor chip and a printed substrate so that a contact area and the adhesion strength between the insulation layer and a redistribution layer, and the insulation layer and an adhesive layer, may be increased. Thus, external stress may be dispersed. Further, the insulation layer, the redistribution layer and the adhesive layer may not peel off each other. As a result, a semiconductor chip package having the above-mentioned structure may have improved reliability.

Having described example embodiments, it is noted that modifications and variations can be made by persons skilled in the art in light of the above teachings. It is therefore to be understood that changes may be made in example embodiments disclosed which are within the scope and the spirit of example embodiments outlined by the appended claims.

What is claimed is:

1. A semiconductor chip structure comprising:
   a semiconductor chip;
   a first insulation layer on the semiconductor chip, the first insulation layer having a plurality of first grooves, which have an upper width and a lower width greater than the upper width, at an upper surface portion of the first insulation layer;
   a redistribution layer partially on the first insulation layer, the redistribution layer having a plurality of first protrusions, which have an upper width and a lower width less than the upper width, at a lower surface portion of the redistribution layer to be interlocked with the plurality of first grooves;
   a second insulation layer on the redistribution layer and the first insulation layer, the second insulation layer having a plurality of second protrusions, which have an upper width and a lower width less than the upper width, at a lower surface portion of the second insulation layer to be interlocked with the plurality of first grooves, and a plurality of second grooves, which have an upper width and a lower width greater than the upper width at an upper surface portion of the second insulation layer; and
   an adhesive layer on the second insulation layer, the adhesive layer having a plurality of third protrusions, which have an upper width and a lower width less than the upper width, interlocked with the plurality of second grooves.

2. The semiconductor chip structure of claim 1, wherein the plurality of first grooves are arranged in a matrix form, a parallel line pattern or a crisscross pattern.

3. The semiconductor chip structure of claim 1, wherein the plurality of first protrusions are arranged in a matrix form, a parallel line pattern or a crisscross pattern.

4. The semiconductor chip structure of claim 1, wherein the first insulation layer includes a negative-type photoresist material.

5. The semiconductor chip structure of claim 1, wherein the redistribution layer has an upper face higher than that of the first insulation layer.

6. The semiconductor chip structure of claim 1, wherein the first insulation layer has a first hole exposing a pad of the semiconductor chip, and the redistribution layer is in the first hole to be connected to the pad.

7. The semiconductor chip structure of claim 6, wherein the second insulation layer has a second hole exposing the redistribution layer in the first hole.

8. A semiconductor chip structure comprising:
   a semiconductor chip;
   a first insulation layer on the semiconductor chip, the first insulation layer having a first hole exposing a pad of the semiconductor chip;
   a redistribution layer partially on the first insulation layer and in the first hole to be connected to the pad;
   a second insulation layer on the redistribution layer and the first insulation layer, the second insulation layer having a plurality of grooves, which have an upper width and a lower width greater than the upper width, at an upper surface portion of the second insulation layer; and
   an adhesive layer on the second insulation layer, the adhesive layer having a plurality of protrusions, which have an upper width and a lower width less than the upper width, interlocked with the the plurality of grooves.

9. A method of manufacturing a semiconductor chip structure, comprising:
   forming a first insulation layer on a semiconductor chip, the first insulation layer having a plurality of first grooves, which have an upper width and a lower width greater than the upper width, formed at an upper surface portion of the first insulation layer;
   partially forming a redistribution layer on the first insulation layer, the redistribution layer having a plurality of first protrusions, which have an upper width and a lower width less than the upper width, formed at a lower surface portion of the redistribution layer to be interlocked with the plurality of first grooves;
   forming a second insulation layer on the redistribution layer and the first insulation layer, the second insulation layer having a plurality of second protrusions, which have an upper width and a lower width less than the upper width, formed at a lower surface portion of the second insulation layer to be interlocked with the plurality of first grooves, and a plurality of second grooves, which have an upper width and a lower width greater than the upper width, formed at an upper surface portion of the second insulation layer; and forming an adhesive layer on the second insulation layer, the adhesive layer having a plurality of third protrusions, which have an upper width and a lower width less than the upper width, interlocked with the plurality of second grooves.

10. The method of claim 9, wherein forming the first insulation layer comprises:
    coating a first negative-type photoresist material on the semiconductor chip to form a lower insulation layer;
    exposing the entire lower insulation layer;
    coating a second negative-type photoresist material on the lower insulation layer to form an upper insulation layer;
    exposing the upper insulation layer, an exposed portion of the upper insulation layer having an upper width and a lower width greater than the upper width; and
    developing the exposed portion of the upper insulation layer.

11. The method structure of claim 9, wherein the plurality of first grooves are arranged in a matrix form, a parallel line pattern or a crisscross pattern.

12. The method of claim 9, wherein the plurality of first protrusions are arranged in a matrix form, a parallel line pattern or a crisscross pattern.

13. The method of claim 9, wherein the redistribution layer has an upper face higher than that of the first insulation layer.

14. The method of claim 9, wherein the redistribution layer is formed by an electroplating process or a deposition process.

15. The method of claim 9, further comprising:
    forming a first hole through the first insulation layer to expose a pad of the semiconductor chip,
    wherein the redistribution layer is formed in the first hole to be connected to the pad.

16. The method of claim 15, wherein the first hole and the plurality of first grooves are formed simultaneously with each other.

17. The method of claim 15, further comprising:
    forming a second hole through the second insulation layer to expose the redistribution layer in the first hole.

18. The method of claim 17, wherein the second hole and the plurality of second grooves are formed simultaneously with each other.

19. A method of manufacturing a semiconductor chip structure, comprising:
    forming a first insulation layer on a semiconductor chip, the first insulation layer having a first hole that exposes a pad of the semiconductor chip;
    partially forming a redistribution layer on the first insulation layer and in the first hole to be connected to the pad;
    forming a second insulation layer on the redistribution layer and the first insulation layer, the second insulation layer having a plurality of grooves, which has an upper width and a lower width greater than the upper width, formed at an upper surface portion of the second insulation layer; and
    forming an adhesive layer on the second insulation layer, the adhesive layer having a plurality of protrusions, which has an upper width and a lower width less than the upper width, interlocked with the the plurality of grooves.

* * * * *